(12) United States Patent
Ikeda

(10) Patent No.: US 6,532,796 B1
(45) Date of Patent: *Mar. 18, 2003

(54) METHOD OF SUBSTRATE TEMPERATURE CONTROL AND METHOD OF ASSESSING SUBSTRATE TEMPERATURE CONTROLLABILITY

(75) Inventor: Masayoshi Ikeda, Tokyo (JP)

(73) Assignee: Anelva Corporation, Fuchu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 585 days.

(21) Appl. No.: 09/273,541

(22) Filed: Mar. 22, 1999

Related U.S. Application Data

(62) Division of application No. 08/976,041, filed on Nov. 21, 1997.

(30) Foreign Application Priority Data

Feb. 21, 1997 (JP) ................................. 9-54116

(51) Int. Cl.⁷ .................. G02M 3/02; G02M 13/00; C23C 14/311
(52) U.S. Cl. ........................ 73/37; 361/234; 118/723; 118/724; 118/728; 156/345; 279/128
(58) Field of Search .................. 73/37, 37.5; 156/498, 156/345; 118/58, 503, 724, 169, 728, 703; 361/234; 279/128

(56) References Cited

U.S. PATENT DOCUMENTS 3,586,027 A 6/1971 Fitzgerald, Jr.
4,362,596 A 12/1982 Desilefs et al.
4,456,038 A 6/1984 Gwaltney et al.
4,615,755 A 10/1986 Tracy et al.
4,671,204 A 6/1987 Ballou (List continued on next page.)

FOREIGN PATENT DOCUMENTS

| JP | 62-263414 A | 11/1987 |
|---|---|---|
| JP | 4-150937 | 5/1992 |
| JP | 5-299379 | 11/1993 |

OTHER PUBLICATIONS

Abstract of JP 5–299379, Nov. 1993; Temperature Control Device and Method Thereof; Mitsubishi Electric (Nov. 1993).
Basic Vacuum Technology; A. Chambers et al.; Adam Hilger; 1989, p. 111 and Standard Graphic Symbols.

*Primary Examiner*—Hezron Williams
*Assistant Examiner*—Michael Cygan
(74) *Attorney, Agent, or Firm*—Burns, Doane, Swecker & Mathis, LLP

(57) ABSTRACT

A method of substrate temperature control for plasma processing apparatus in which a substrate which is being held on a substrate holder in a process chamber is being processed, and He gas is passed through the gap between the substrate and the substrate mounting surface during the processing of the substrate, the substrate temperature is controlled by the thermal transfer characteristics of the gas and the substrate is cooled to the prescribed temperature, and the pressure of the He gas is preset by a pressure setting part 50a, the actual pressure is measured with a pressure gauge 49, and the gas flow rate is controlled in such a way that the measured pressure becomes equal to the set pressure by a pressure control valve 46. Furthermore, the substrate temperature controllability is assessed by monitoring the gas flow rate with a substrate temperature controllability assessment part 50b.

2 Claims, 5 Drawing Sheets

U.S. PATENT DOCUMENTS

| | | |
|---|---|---|
| 4,771,730 A | 9/1988 | Tezuka |
| 4,798,521 A | 1/1989 | Schmidt et al. |
| 4,963,713 A | 10/1990 | Horiuchi et al. |
| 5,093,579 A | 3/1992 | Amemiya et al. |
| 5,203,958 A | 4/1993 | Arai et al. |
| 5,267,607 A | 12/1993 | Wada |
| 5,367,797 A | 11/1994 | Zaim |
| 5,464,038 A | 11/1995 | Kruto |
| 5,491,603 A | 2/1996 | Birang et al. |
| 5,641,231 A | 6/1997 | Inaba |
| 5,671,119 A | 9/1997 | Huang et al. |
| 5,673,750 A | 10/1997 | Tsubone et al. |
| 5,730,166 A | 3/1998 | Ackerley et al. |
| 5,775,416 A | 7/1998 | Heimanson et al. |
| 5,810,933 A | 9/1998 | Mountsier et al. |
| 5,822,172 A * | 10/1998 | White .................... 361/234 |
| 5,870,271 A | 2/1999 | Herchen |
| 5,883,778 A | 3/1999 | Sherstinsky et al. |
| 5,906,684 A | 5/1999 | Tamura et al. |
| 5,948,986 A | 9/1999 | Brown |
| 6,012,474 A | 1/2000 | Takamoto et al. |

\* cited by examiner

METHOD OF SUBSTRATE TEMPERATURE CONTROL AND METHOD OF ASSESSING SUBSTRATE TEMPERATURE CONTROLLABILITY

This application is a divisional, of Application Ser. No. 08/976,041, filed Nov. 21, 1997.

BACKGROUND OF THE INVENTION

1. Field of the Invention

The present invention concerns a method of substrate temperature control, and a method of assessing substrate temperature controllability in a substrate processing apparatus, and in particular it concerns a method of controlling the substrate temperature which can be used in a substrate processing apparatus in which a substrate is held on a substrate holder by means of an electrostatic force and a heat transfer gas for substrate cooling purposes is passed between the substrate and the electrostatic chucking stage, and a method of assessing the controllability of the substrate temperature.

2. Description of Related Art

A conventional method of substrate temperature control in a plasma processing apparatus is described below with reference to FIG. 4 and FIG. 5. Any plasma source can be used in this plasma processing apparatus, and it is not shown in the drawing. In the drawings, reference number 101 is the process chamber, and the construction of its upper part is not shown in the drawing. A substrate holder 102 is arranged in the bottom part of the process chamber 101, and a substrate 103 is arranged on the substrate holder 102. The substrate 103 is held by means of an electrostatic chucking stage 104. The substrate holder 102 comprises a bias electrode 105 and a circulator 106, which circulates a cooling medium which cools the electrostatic chucking stage 104. A substrate bias electrode radio frequency power source 107 and a direct current power source 108 are connected to the bias electrode 105.

A gap is formed between the substrate 103 and the electrostatic chucking stage 104. An inert gas, such as helium (He) gas for example, is supplied into this space by means of a pipe 109. He gas is present and functions as a heat transfer gas, which enhances the thermal transfer characteristics between the substrate 103 and the electrostatic chucking stage 104 and cools the substrate 103. Moreover, reference number 110 is a conventional helium pressure control apparatus and reference number 111 is an evacuation pump which exhausts the He gas. The pressure of the aforementioned He gas is controlled by means of the helium pressure control apparatus 110 and the evacuation pump 111. The helium pressure control apparatus 110 comprises a helium pressure controller 112, a pressure gauge 113, a mass flow controller 114, valves 115 and 116, and a bypass valve 117.

The substrate 103 which is held on the substrate holder 102 by an electrostatic force is subjected to an etch process with the plasma which is generated by the plasma source. During this process, a radio frequency (RF) is applied to the bias electrode 105 from the RF power source 107, and a self bias voltage is generated at the surface of the substrate 103. A direct current (DC) voltage is applied from the DC power source 108, and an electrostatic force is generated by the potential difference between the DC voltage and the self bias voltage, and this holds the substrate 103.

The method of controlling the He gas pressure is described below. Thus, He gas pressure control is achieved by means of the helium pressure controller 112. The helium pressure controller 112 sends a set flow-rate value via a signal line 118 to the mass flow controller 114 and recognizes the measured pressure which is sent from the pressure gauge 113 via a signal line 119. Thus, the helium pressure controller 112 sends open or close signals via a signal line 120 when the measured pressure is displaced from the set pressure value, the bypass valve 117 is opened or closed, and the He gas pressure is controlled.

This is described in more detail below with reference to FIG. 5. When the substrate 103 is not being etched, the valve 115 is closed, the bypass valve 117 is open and the valve 116 is closed. Moreover, the set He gas flow rate of the mass flow controller 114 is set to 0 sccm, and the set pressure value for the He gas is 0 Torr. The He gas pressure control which is carried out during the etch process of the substrate 103 starts after the substrate bias electrode RF power source 107 has been switched ON. At this time, the valve 115 is switched from closed to open, the bypass valve 117 is switched from open to closed, and the valve 116 is switched from closed to open. For pressure control, a set flow rate value signal for 20 sccm He gas is sent from the helium pressure controller 112 to the mass flow controller 114, and the He gas pressure is brought up to the set pressure value of 15 Torr.

With this pressure control, no He gas flows after the He gas measured pressure value has reached the set pressure value. A small amount, for example some 0.5 sccm, of He gas leaks into the space inside the process chamber 101 from between the substrate 103 and the electrostatic chucking stage 104. The measured He gas pressure falls below the set pressure value. He gas in an amount slightly greater than the amount which is leaked out, for example 0.6 sccm, is passed, and a fall in the measured He gas pressure is prevented. When the pressure exceeds the set pressure value, by 5 Torr for example, the bypass valve 117 is opened and He gas is exhausted with the evacuation pump 111 until the measured He gas pressure reaches the set pressure value of 15 Torr. The bypass valve 117 is closed again when the measured pressure reaches the set pressure value. Subsequently, the operation of the region indicated by 121 in FIG. 5 is repeated and the He gas pressure is controlled until the RF power source 107 is switched OFF. With this pressure control, the valve 116 is switched from open to closed and the bypass valve 117 is switched from closed to open at the same time as the RF power source 107 is switched OFF. Moreover, the set flow rate of the mass flow controller 114 is set to 0 sccm and the set pressure value is set to 0 Torr. The He gas between the substrate 103 and the electrostatic chucking stage 104 is exhausted for a fixed period of time with the evacuation pump 111, and then the valve 115 is switched from open to closed.

OBJECTS AND SUMMARY

In the conventional method of He gas pressure control, the control of He gas pressure during the interval 121 shown in FIG. 5 is carried out simply by opening and closing the bypass valve 117. However, fine control of the He gas pressure between the substrate 103 and the electrostatic chucking stage 104 by simply opening and closing the bypass valve 117 is very difficult in practice. The variability in the change in the measured pressure with respect to the set pressure value is considerable. As a result, a variability arises in the substrate temperature from substrate to substrate when substrates 103 are continually being subjected to an etch process. Such a variability of the substrate temperature results in a variability between substrates in the selectivity to the mask and the selectivity to the underlying layer which are sensitive to changes in the substrate temperature. As a result, the reproducibility of the etch profile is poor.

In general plasma processing apparatus with which etching is carried out, by-products which are formed during the etching process become attached to the electrostatic chucking stage as many substrates are etched repeatedly, the state of chucking between the substrate and the electrostatic chucking stage becomes inadequate and so the cooling of the substrate becomes inadequate and the substrate temperature rises. If the substrate etch process is carried out at a high temperature, then a problem arises in that the reproducibility of the etch profile becomes poor. In terms of this problem, execution of the etch process at high temperatures can be avoided if the etch process which is being carried out continuously is stopped when the state of chucking between the substrate and the electrostatic chucking stage becomes poor. However, with the conventional plasma processing apparatus described above there is no mechanism for determining whether the state of chucking between the substrate and the electrostatic chucking stage is good or bad, and so it is impossible to avoid execution of the substrate etch process at high temperature.

The problems described above are problems which occur generally in substrate processing apparatus.

An aim of the invention is to provide a method of substrate temperature control for a substrate processing apparatus with which the control of the heat transfer gas such as helium gas is improved, and with which the controllability of the substrate temperature is improved.

Another aim of the invention is to provide a method of assessing the substrate temperature controllability in a substrate processing apparatus where a heat transfer gas is being used, wherein the state of the substrate temperature control is assessed by monitoring the state of the gap between the substrate and the surface of the electrostatic chucking stage on which the substrate is arranged.

According to a method of the present invention, the pressure of the heat transfer gas which is flowing in the gap between the substrate and the substrate mounting surface of the substrate holder is measured and the flow rate of the heat transfer gas is controlled in such way that the measured pressure of the heat transfer gas becomes equal to a preset pressure value. Control of the substrate temperature is achieved in accordance with the heat transfer characteristics of the heat transfer gas which is flowing in the gap between the substrate and the surface of the substrate mounting surface of the substrate holder.

To execute this method of substrate temperature control, a means of establishing the target pressure of heat transfer gas (a pressure setting part) and a means for measuring the actual pressure of the heat transfer gas which is being introduced into the abovementioned gap (pressure gauge) are established in the structure of the apparatus. The set pressure value and the measured pressure are compared and the flow rate of the heat transfer gas is controlled on the basis of the difference between these values in such a way that the difference becomes zero. The control is carried out in such a way that the measured pressure rapidly approaches the set pressure value, and rapid control is achieved without giving rise to variability in the control.

The abovementioned method of substrate temperature control according to this invention is preferably such that the pressure control valve which has been established in the heat transfer gas flow way controls the flow rate of the heat transfer gas in such a way that the measured pressure becomes equal to the set pressure value with the input of a signal for the set pressure value from the pressure setting part and the input of a signal for the measured pressure from the pressure gauge.

The abovementioned method of substrate temperature control is preferably such that the abovementioned substrate is held on an electrostatic chucking stage which is included in the substrate holder.

According to one embodiment of the present invention, the pressure of the heat transfer gas which is flowing in the gap between the substrate and the substrate mounting surface of the substrate holder is measured, the flow rate of the heat transfer gas is controlled in such a way that the measured pressure of the heat transfer gas becomes equal to a preset pressure value, and then the state of the gap between the substrate and the substrate mounting surface is assessed on the basis of a comparison of this flow rate of the heat transfer gas and a standard value.

According to the present invention, it is possible to obtain information concerning the actual flow rate of the heat transfer gas for controlling the transfer gas flow rate. In terms of the actual flow rate of the heat transfer gas, the amount of heat transfer gas which leaks from the gap between the substrate and the electrostatic chucking stage depends on the size of the gap. Moreover, the size of this gap is determined by the state in which the substrate is held on the substrate holder. The actual flow rate of the heat transfer gas which is detected is monitored. The state of the thermal transfer characteristics in the abovementioned gap, which is to say the state of substrate temperature controllability, can be assessed by comparing this with a standard flow rate of heat transfer gas.

The abovementioned method of assessing substrate temperature controllability of this invention preferably assesses the substrate temperature controllability by assessing the state of electrostatic force between the substrate and the electrostatic chucking stage.

With the method of controlling substrate temperature of this invention, the set pressure value of the heat transfer gas and the actual measured pressure are compared and the heat transfer gas flow rate is controlled in such a way that the measured pressure rapidly becomes equal to the set pressure value, and so control of the heat transfer gas pressure is improved. Hence, the thermal transfer characteristics of the heat transfer gas can be maintained at the optimum level and substrate temperature controllability is improved.

With the method of assessing substrate temperature controllability of this invention, the flow rate of the heat transfer gas which is introduced into the gap between the substrate and the electrostatic chucking stage is monitored and, by comparing this with a standard flow rate, it is possible to assess whether the state of substrate temperature control using the heat transfer gas is good or bad.

DETAILED DESCRIPTION OF THE PREFERRED EMBODIMENTS

Figure 1:
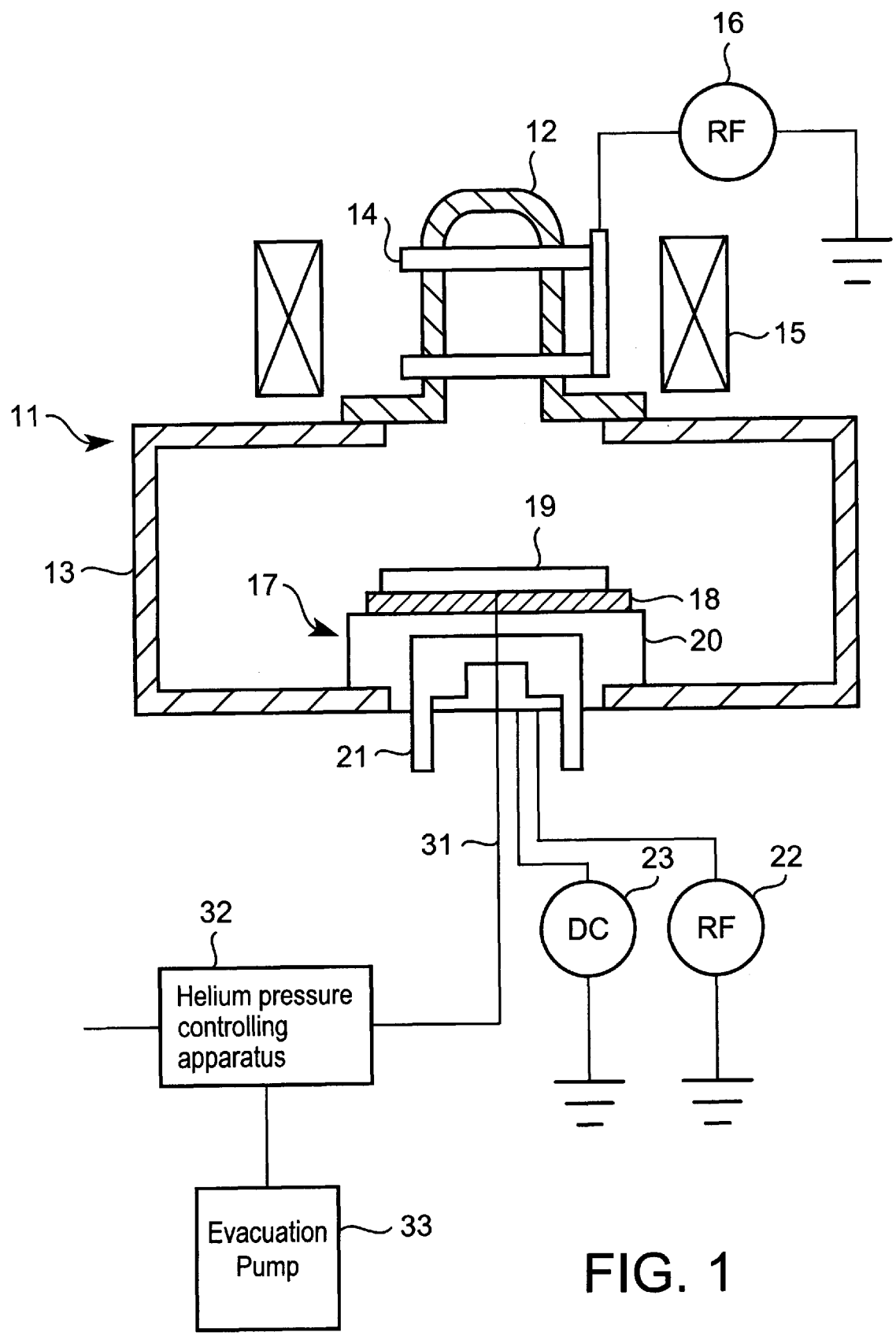
FIG. 1 shows a substrate temperature control in a plasma processing apparatus which is a typical embodiment of the invention.
Figure 2:
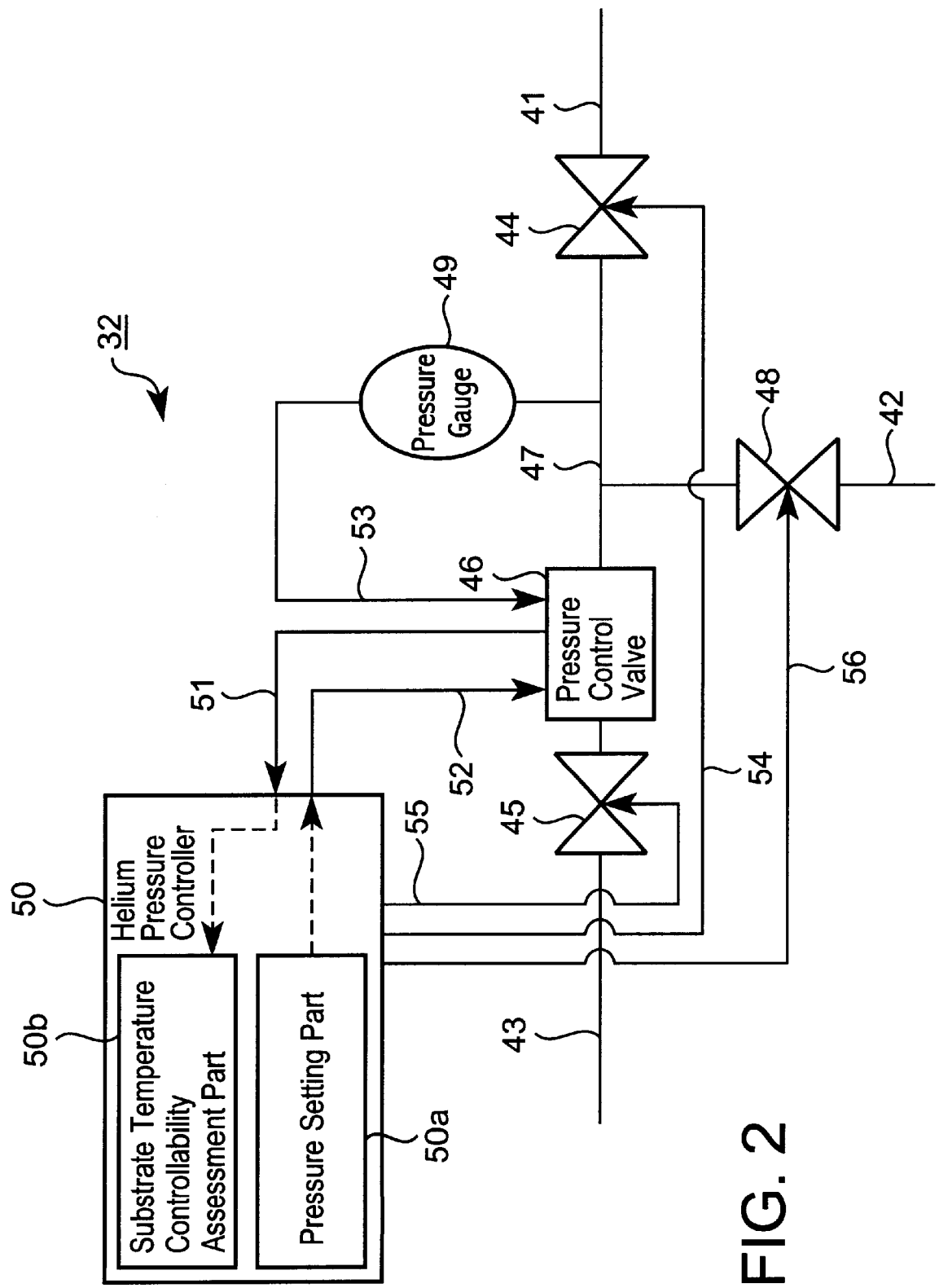
FIG. 2 is a detailed drawing of the helium pressure control apparatus shown in FIG. 1.

A typical embodiment of the present invention is shown in FIG. 1, and the detailed structure of a part thereof is shown in FIG. 2. The substrate processing apparatus of this embodiment is a plasma processing apparatus. This is used for etching substrates using plasma, or for CVD processing. A helicon wave excited plasma source is used in the plasma processing apparatus of this embodiment.

Such a plasma processing apparatus is described below with reference to FIG. 1. A process chamber 11 comprises a vacuum chamber 12 for plasma generation purposes (referred to hereinafter as the generating chamber) and a vacuum chamber 13 for plasma diffusion purposes (referred to hereinafter as the diffusion chamber). The generating chamber 12 is arranged in the top wall of the diffusion chamber 13, and the spaces within each of these chambers are connected. A helicon wave exciting antenna 14 is arranged in a region outside the generating chamber 12. An electromagnet 15 for generating a magnetic field is arranged in the region outside the antenna 14. The antenna 14 is connected to a plasma generating RF power source 16. Plasma is generated in the space inside the generating chamber 12 to which the process gas has been supplied by means of a process gas supply mechanism (not shown in the drawing) when the power of a fixed electric field is supplied by the antenna 14. The distribution of the plasma in the generating chamber 12 is controlled by the electromagnet 15.

A substrate holder 17 is arranged on the lower side within the diffusion chamber 13. An electrostatic chucking stage 18 is established on the top of the substrate holder 17, and a substrate 19 is held on the electrostatic chucking stage 18 by an electrostatic force. The surface of the substrate 19 faces the space within the generating chamber 12 which is located above. The plasma which has been generated in the generating chamber 12 enters the diffusion chamber 13, diffuses over the substrate 19 and processes the surface of the substrate 19 which is being held on the substrate holder 17.

A bias electrode 20, and a circulator 21 which circulates a cooling medium which cools the bias electrode 20 and the abovementioned electrostatic chucking stage 18 to a prescribed temperature are established in the substrate holder 17. An RF power source 22, which imparts a bias voltage to the bias electrode 20, and a DC power source 23 for generating the electrostatic force by which the substrate 19 is held on the electrostatic chucking stage 18, are connected to the substrate holder 17.

In the abovementioned embodiment, the thermal transfer characteristics between the substrate and the electrostatic chucking stage are controlled in order to control (cool) the temperature of the substrate 19 which is being held on the electrostatic chucking stage 18 during substrate processing. He gas is passed at the required pressure between the substrate 19 and the electrostatic chucking stage 18 in order to control the thermal transfer characteristics. This He gas is used as a heat transfer gas between the substrate 19 and the electrostatic chucking stage 18. The pressure of the He gas is controlled by a helium pressure control apparatus 32. The He gas is exhausted by means of an evacuation pump 33. The supply of He gas to the gap between the substrate 19 and the electrostatic chucking stage 18 and the exhausting of the He gas from this gap are carried out via a pipework 31. The He gas supply tank is not shown in the drawing.

To carry out plasma processing in the process chamber 11, the process chamber 11 is pumped out to the ultimate pressure by means of a pumping mechanism and a pressure control mechanism, which are not shown in the drawing. The required amount of process gas is introduced by means of a process gas delivery mechanism and a mass flow controller, which are not shown in the drawing.

The helium pressure control apparatus 32 is described in detail below with reference to FIG. 2. The pipework 41 is connected to the abovementioned pipework 31 and the pipework 42 is connected to the evacuation pump 33, and the pipework 43 is connected to a He supply tank which is not shown in the drawing. Valves 44 and 45 are established in the pipeworks 41 and 43, respectively, and a pressure control valve 46 is established between the valves 44 and 45 in the pipework 43. The pipework 42, which is connected to the evacuation pump 33, is connected to the part of the pipework 47 between the pressure control valve 46 and the valve 44. A bypass valve 48, through which the He gas is passed during evacuation, is established in part of the pipework 47.

A pressure gauge 49 for measuring the pressure of the He gas in the pipework 47 is established in part of the pipework.

A helium pressure controller 50 is provided for this pipework system. The helium pressure controller 50 includes a pressure setting part 50a and a substrate temperature controllability assessment part 50b, and it also includes other required functional parts, such as, valve opening and closing controls. The helium pressure controller 50 receives a measured He gas flow rate signal 51 from the pressure control valve 46 as input, and a He gas flow rate (the He gas pressure value) setting command signal 52 for the pressure control valve 46 is output from the helium pressure controller 50.

The pressure control valve 46 receives a measured He gas flow rate (He gas pressure value) signal 53 from the pressure gauge 49 as input. Moreover, the helium pressure controller 50 controls the opening and closing of the valves 44 and 45 and the opening and closing of the bypass valve 48 on the basis of the opening and closing command signals 54, 55 and 56.

The substrate processing operation with the plasma processing apparatus described above is described below.

The interior of the generating chamber 12 and the diffusion chamber 13 is pumped out using the pumping mechanism and the pressure is reduced to the ultimate pressure. Then, the process gas of which the flow rate is controlled by the flow rate controlling mechanism is introduced into each of the abovementioned chambers 12 and 13. Control is achieved with the pressure controlling mechanism in such a way that the pressure within the chambers is the required pressure.

Next, the RF power which is supplied from the RF power source 16 is supplied to the internal space of the generating chamber 12 via the helicon wave exciting antenna 14. Plasma is generated within the generating chamber 12 by the electric field which is applied by the antenna 14. The plasma which is generated diffuses into the diffusion chamber 13.

On the other hand, the substrate 19 which has been transferred by means of a transfer mechanism (not shown in the drawing) is held on the substrate holder 17 in the diffusion chamber 13. A voltage is applied to the bias electrode 20 by means of the DC power source 23. An electrostatic attractive force is produced as a result of this voltage and the substrate 19 is held on the electrostatic chucking stage 18. RF power is supplied to the bias electrode 20 from the RF power source 22, and the substrate 19 is etched by the plasma which has diffused-from the generating chamber 12.

During the abovementioned etch process, the bias electrode 20 and the electrostatic chucking stage 18 are cooled by means of a cooling medium which is circulated by the circulator 21 and controlled to the prescribed temperature.

He gas is supplied to the gap between the substrate 19 and the electrostatic chucking stage 18, or exhausted from said gap, via the pipework 31. The thermal transfer characteristics between the substrate 19 and the electrostatic chucking stage 18 are controlled by controlling the pressure (flow rate) of He gas between the substrate 19 and the electrostatic chucking stage 18. In this way the temperature of the substrate 19 is controlled to the prescribed temperature in relation to the temperature of the electrostatic chucking stage 18.

Figure 3:
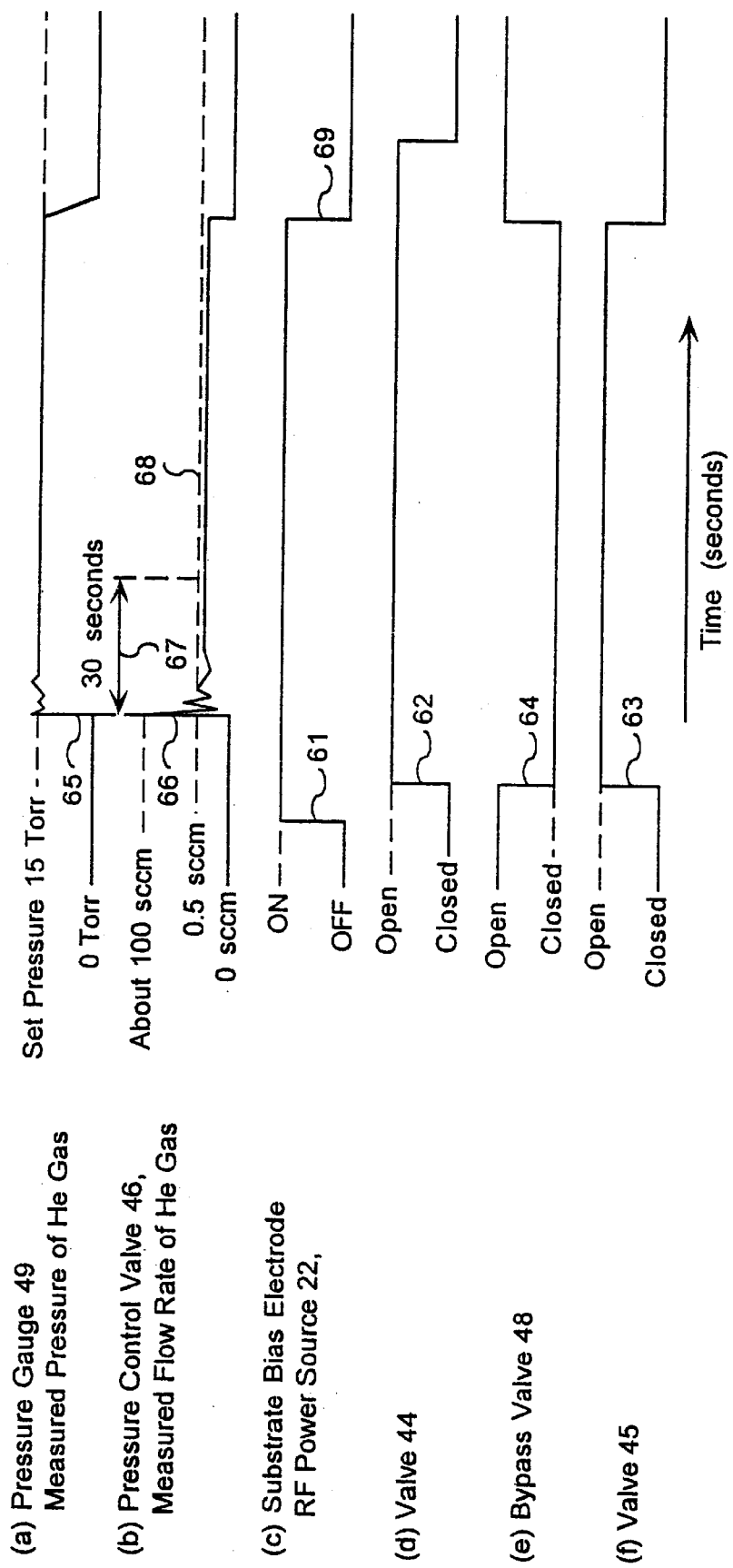
FIG. 3 is a timing chart of the control procedure.
Figure 4:
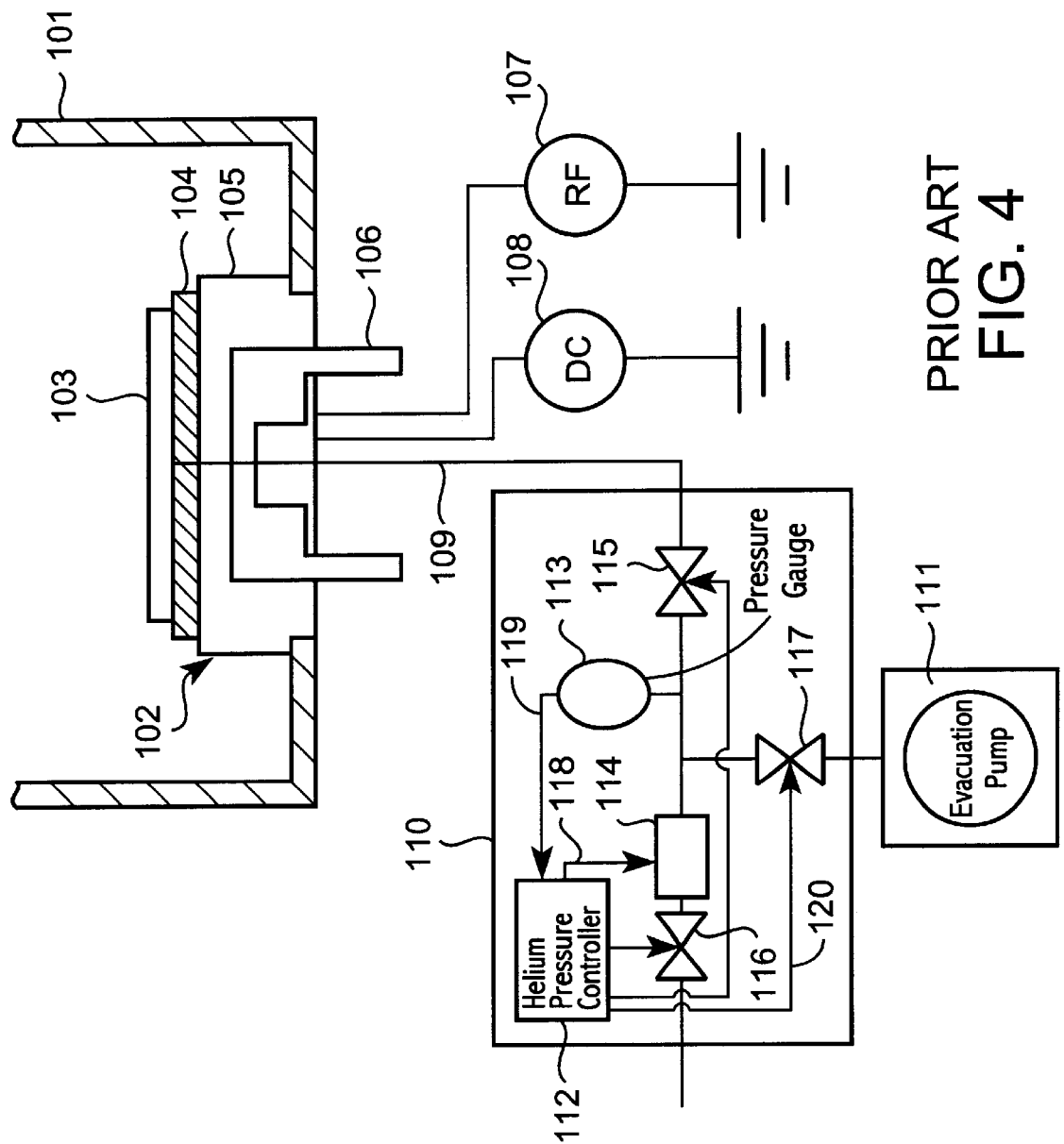
FIG. 4 is a drawing which shows substrate temperature control in a conventional plasma processing apparatus.
Figure 5:
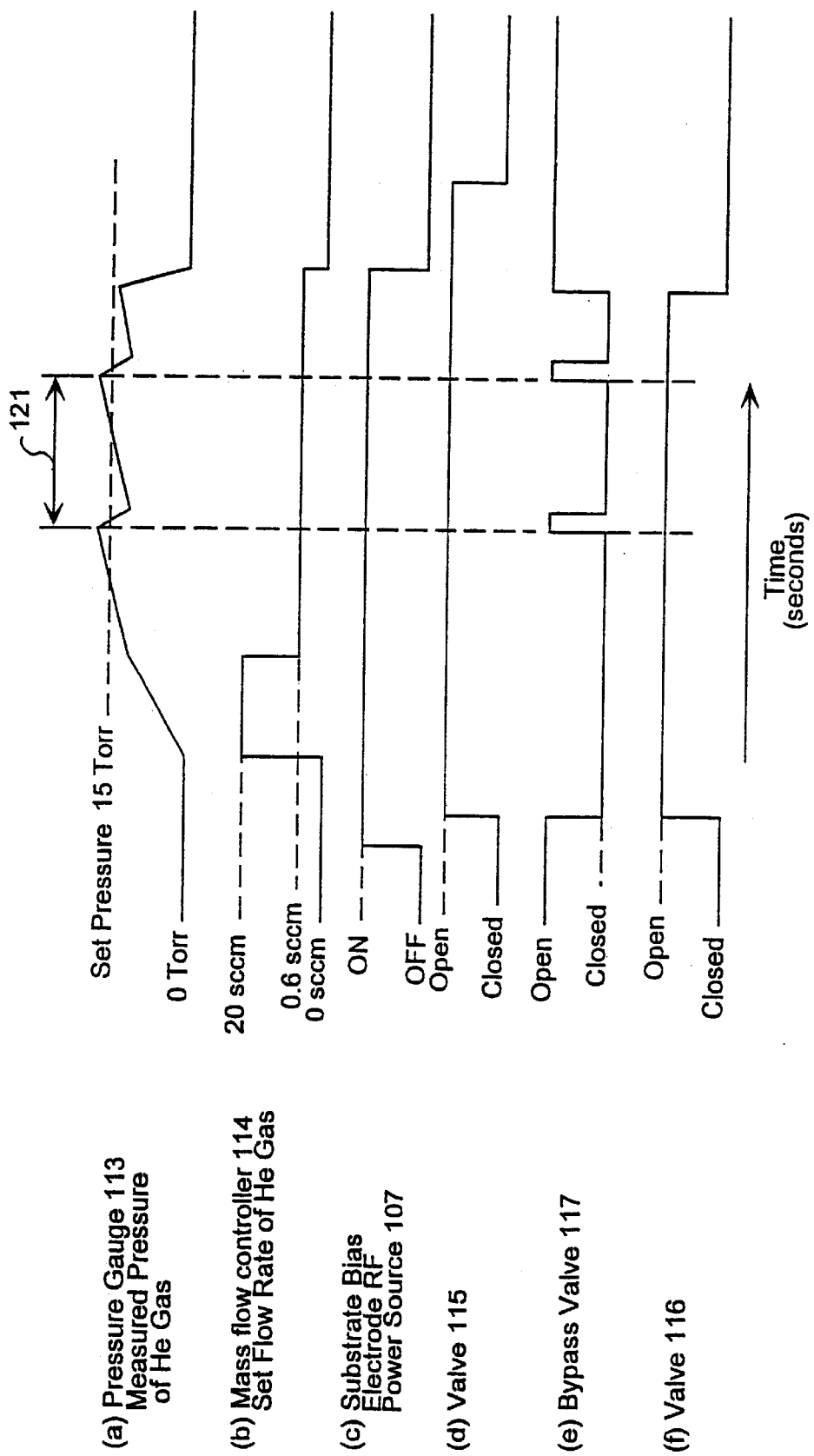
FIG. 5 is a timing chart showing the details of the conventional control.

The method of controlling the He gas pressure in this embodiment is described below with reference to the abovementioned FIGS. 1 and 2, and also FIG. 3, and the method of controlling the substrate temperature on the basis of the method of controlling the He gas pressure is also described. FIG. 3 is a timing chart which shows the details of the He gas pressure control.

The control of the He gas pressure is carried out by the abovementioned helium pressure controller 50. As shown in FIG. 2, the helium pressure controller 50 supplies a set command signal 52 to the pressure control valve 46 by means of the pressure setting part 50a. The data concerning the set pressure value is supplied to the pressure control valve 46 by this means. The measured pressure from the pressure gauge 49 is supplied to the pressure control valve 46 as a measurement signal 53. The pressure control valve 46 compares the set pressure value supplied from the helium pressure control part 50 and the measured pressure supplied from the pressure gauge 49 and adjusts the He flow rate in such a way as make the measured pressure equal to the set pressure value. Control of the He gas pressure is carried out in this way.

The He gas pressure control based on the control actions of the helium pressure controller 50 and the pressure control valve 46 is described in detail below with reference to FIG. 3.

When the substrate 19 is not being etched, the valves 44 and 45 are closed, the bypass valve 48 is open and the set pressure value of the pressure control valve 46 is set to approximately 0 Torr. At this time, the measured flow rate of the He gas which is being introduced is approximately 0 sccm.

When the substrate 19 is set, the substrate bias electrode RF power source 22 is switched ON (change 61) and then pressure control with the helium pressure controller 50 is started. The valves 44 and 45 are switched from closed to open (changes 62 and 63) and the bypass valve 48 is switched from open to closed (change 64) by pressure control with the helium pressure controller 50. Moreover, the helium pressure controller 50 supplies the set pressure value, for example the 15 Torr set command signal 52, to the pressure control valve 46. In the state before executing this pressure control, the measured pressure value is 0 Torr, and so a high He gas flow rate (for example, about 100 sccm) is passed by the pressure control valve 46 on the basis of the difference between the set pressure value and the measured pressure. As a result of this, control such that the measured pressure reaches the set pressure value is carried out in a short period of time (within about 1 second) (states 65 and 66). As the measured pressure obtained from the pressure gauge 49 gradually approaches the set pressure value, the pressure control valve 46 passes a gradually reducing flow rate of He so as to match the difference between the set pressure value and the measured pressure so that the measured pressure approaches the set pressure value asymptotically. After a suitable period of time (for example 30 seconds, period 67 in FIG. 3) has elapsed after introducing He gas, the pressure control valve 46 has executed control in such a way that the measured pressure is more or less equal to the set pressure value. As a result, the He gas flow rate becomes constant (for example, about 0.5 sccm, state 68 in FIG. 3). This fixed flow rate value corresponds to the extent of the leakage of the He gas which is lost from between the substrate 19 and the electrostatic chucking stage 18. Subsequently, He gas corresponding to the amount which is leaking from between the substrate 19 and the electrostatic chucking stage 18 is passed by the pressure control valve 46 during the interval until the RF power source 22 is switched OFF (change 69). By this means, the measured pressure value and the set pressure value are matched during the etch process.

When the RF power source 22 is switched OFF, the valve 45 is switched from open to closed and the bypass valve 48 is switched from closed to open at the same time. Furthermore, the valve 44 is closed after being held open for a fixed interval of time. When this is done the measured pressure reverts to 0 Torr.

With this method of substrate temperature control using pressure control of the He gas, the variability of the measured pressure of the He gas can be reduced and it is possible to carry out substrate temperature control using the thermal transfer characteristics of He gas both quickly and in a stable manner.

This embodiment will now be described from the viewpoint of the method of assessing the substrate temperature controllability in the abovementioned plasma processing apparatus, with reference once again to FIGS. 1 to 3.

With the pressure control system of FIGS. 1 and 2, the amount of He gas leaking from between the substrate 19 and the electrostatic chucking stage 18 during the etch process can be estimated by the helium pressure controller 50 on the basis of the measured flow rate signal 51 which is sent from the pressure control valve 46. The amount of He gas which leaks out is determined by the state of chucking between the substrate 19 and the electrostatic chucking stage 18. The state of chucking between the substrate 19 and the electrostatic chucking stage 18 can be monitored using the measured flow rate which is obtained as the measured signal 51. Monitoring of the state of chucking in this way is carried out starting after a fixed interval of time (for example, about 30 seconds) after introducing the He gas between the substrate 19 and the electrostatic chucking stage 18. This monitoring assesses that the state of chucking between the substrate 19 and the electrostatic chucking stage 18 is satisfactory when the estimated leakage from between the substrate 19 and the electrostatic chucking stage 18 is 0.5 sccm, or below, for example, and that it is inadequate when it is greater than 0.5 sccm. The substrate 19 is not being chucked on the electrostatic chucking stage 18 satisfactorily when the amount of He gas leaking out is high. Temperature control of the substrate 19 becomes unsatisfactory and the temperature of the substrate rises. Hence, it is possible by monitoring the state of the electrostatic force of the substrate 19 to assess the temperature controllability of the substrate 19 using the measured flow rate of He gas with the measurement signal 51. This assessment is carried out by the substrate temperature controllability assessment part 50b of the helium pressure controller 50. The substrate temperature controllability assessment part 50b stops the etch process when the measured flow rate based on the measurement signal 51 rises and it is assessed that the state of chucking is unsatisfactory.

With the method of assessing substrate temperature controllability described above, the etch process is stopped when the cooling of the substrate is inadequate and the etch process is being carried out at a temperature higher than the normal temperature, and it enables poor etching of the substrate to be prevented.

The invention is not limited to the embodiment described above, and it can be used generally with other types of plasma processing apparatus, and it can also be used in cases where a plasma source other than a helicon wave plasma source is being used. Moreover, the gas which is used for substrate cooling is not limited to He gas, and other gases can also be used.

What is claimed is:

1. A method of assessing a substrate condition of a substrate, comprising the steps of:

delivering a heat transfer gas to a control device including an exhaust valve and a pressure control valve;

supplying a set pressure value to the pressure control valve;

closing the exhaust valve so that all of the heat transfer gas passing the pressure control valve is delivered to a gap between the substrate and a substrate mounting surface of a substrate holder;

measuring the pressure of the heat transfer gas which is flowing in the gap between the substrate and the substrate mounting surface of the substrate holder;

supplying the measured pressure to the pressure control valve;

automatically controlling the flow rate of the heat transfer gas with the pressure control valve on the basis of a difference between the set pressure value and the measured pressure such that the measured pressure of the heat transfer gas becomes equal to the set pressure value and the flow rate corresponds to a leakage rate of the heat transfer gas; and assessing a state of the gap between the substrate and the substrate mounting surface on a basis of a comparison of the heat transfer gas flow rate with a standard value.

2. The method of assessing a substrate condition according to claim 1, wherein the substrate holder includes an electrostatic chucking stage, and temperature controllability of the substrate is assessed by assessing a state of electrostatic force between the substrate and the electrostatic chucking stage.

* * * * *